(12) United States Patent
Umeda et al.

(10) Patent No.: US 9,025,408 B2
(45) Date of Patent: May 5, 2015

(54) SEMICONDUCTOR INTEGRATED CIRCUIT AND INFORMATION PROCESSING APPARATUS

(71) Applicant: Kabushiki Kaisha Toshiba, Minato-ku, Tokyo (JP)

(72) Inventors: Toshiyuki Umeda, Inagi (JP); Shoji Otaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/258,665

(22) Filed: Apr. 22, 2014

(65) Prior Publication Data

US 2014/0362655 A1    Dec. 11, 2014

(30) Foreign Application Priority Data

Jun. 11, 2013  (JP) ................................. 2013-122640

(51) Int. Cl.
   *G11C 5/14*   (2006.01)
   *H03L 5/00*   (2006.01)

(52) U.S. Cl.
   CPC . *H03L 5/00* (2013.01); *G11C 5/148* (2013.01)

(58) Field of Classification Search
   USPC ....................................................... 365/227
   See application file for complete search history.

(56) References Cited

U.S. PATENT DOCUMENTS

2011/0141098 A1* 6/2011 Yaguma et al. ................ 345/212
2012/0062192 A1* 3/2012 Okuma ......................... 323/272

FOREIGN PATENT DOCUMENTS

JP         07-273286 A     10/1995

* cited by examiner

*Primary Examiner* — Harry W Byrne
(74) *Attorney, Agent, or Firm* — Holtz, Holtz, Goodman & Chick PC

(57) ABSTRACT

According to an embodiment, a semiconductor integrated circuit includes a regulator, a level shifter and a switch circuit. The regulator converts an input voltage that is a difference in potential between a first terminal and a third terminal into an output voltage that is a difference in potential between a second terminal and the third terminal. The level shifter adjusts a voltage level between a first terminal and a second terminal. The switch circuit includes a first switch selectively connecting the third terminal of the regulator to a first potential, a second switch selectively connecting the third terminal of the regulator to the first terminal of the level shifter, and a third switch selectively connecting the third terminal of the regulator to a second potential.

10 Claims, 3 Drawing Sheets

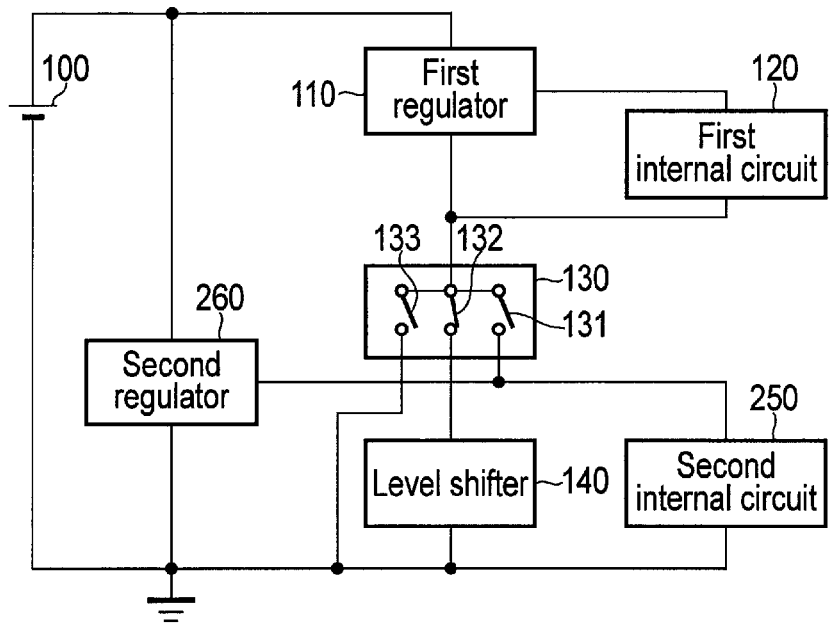
F I G. 3
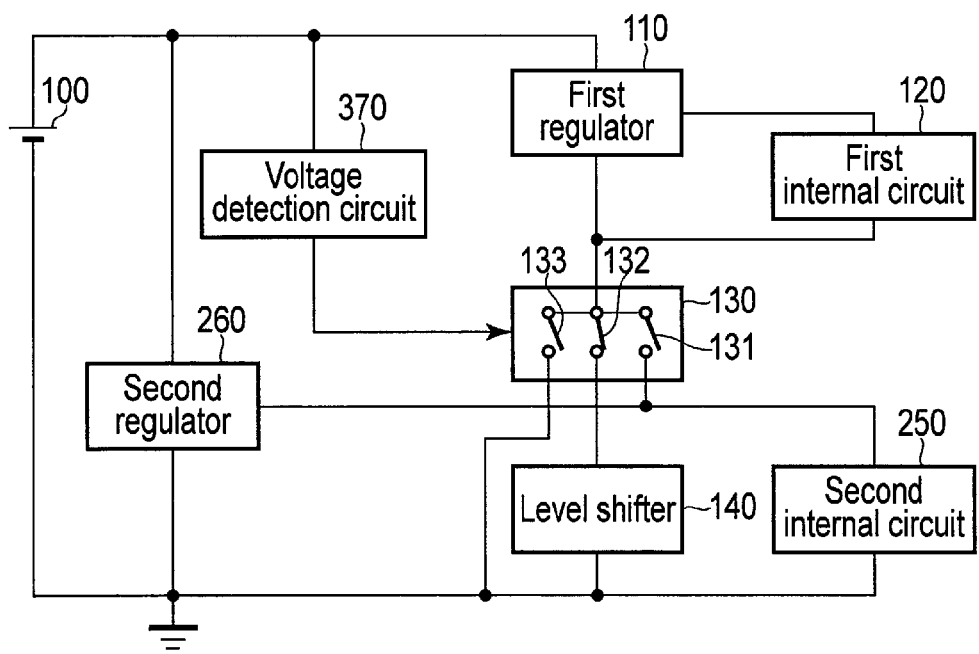
F I G. 4

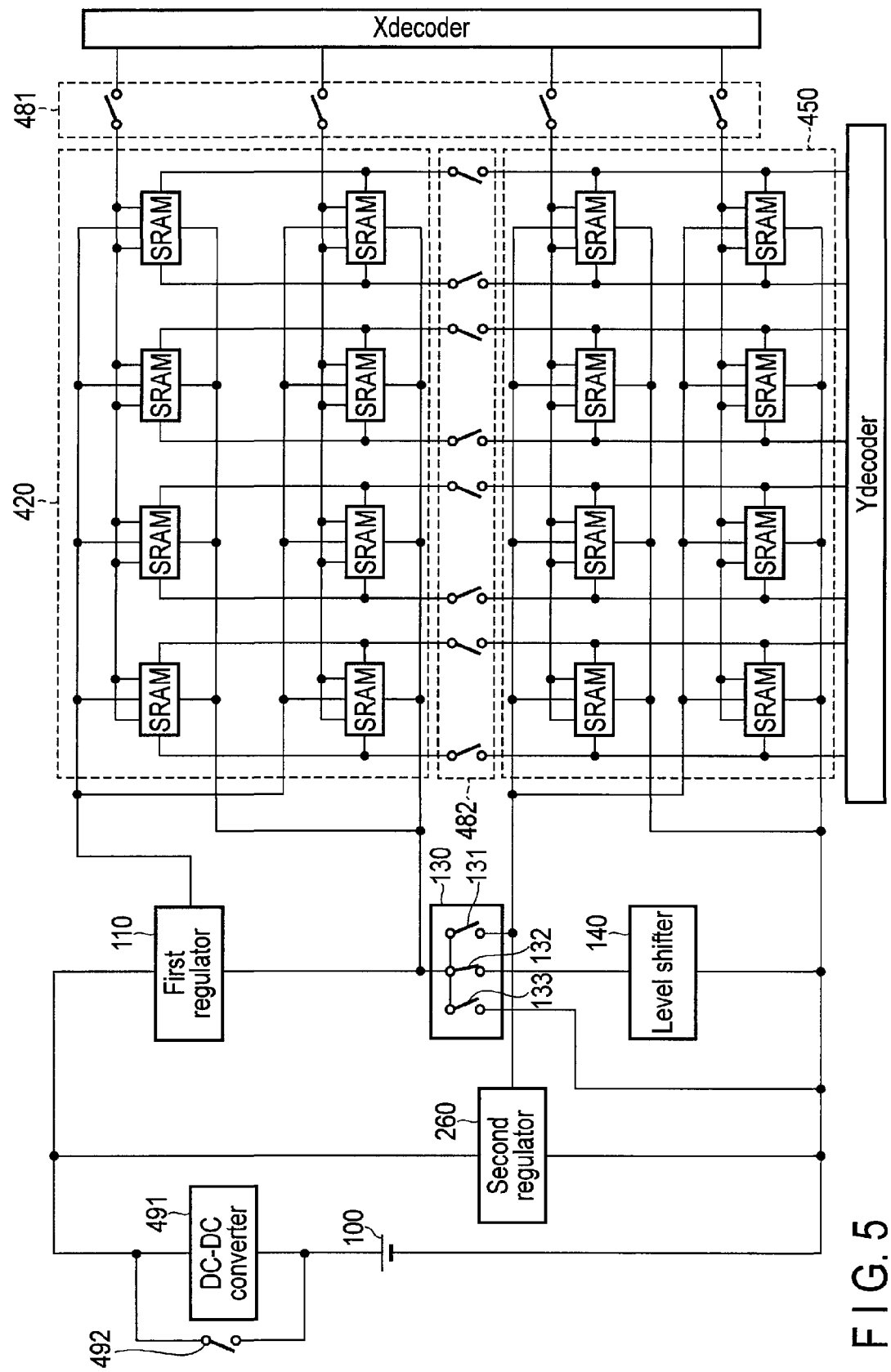
F I G. 5

SEMICONDUCTOR INTEGRATED CIRCUIT AND INFORMATION PROCESSING APPARATUS

CROSS-REFERENCE TO RELATED APPLICATIONS

This application is based upon and claims the benefit of priority from Japanese Patent Application No. 2013-122640, filed Jun. 11, 2013, the entire contents of which are incorporated herein by reference.

FIELD

Embodiments relate to a semiconductor circuit and an information processing apparatus.

BACKGROUND

In recent years, larger-scale semiconductor integrated circuits have been provided, for example, by utilizing complementary metal-oxide semiconductors (CMOS). This enables various internal circuits, for example, an analog signal processing circuit, a digital signal processing circuit, and a memory circuit, to be incorporated into a semiconductor integrated circuit. CMOSs have been miniaturized in order to promote an increase in the scale of semiconductor integrated circuits and improvement of the functions of semiconductor integrated circuits.

Miniaturized CMOSs have a reduced withstand voltage, precluding the internal circuits from utilizing a high driving voltage. The internal circuits currently have a specified voltage of, for example, 1.2 V. In this case, the internal circuits can operate normally when the driving voltage is about 1.0 V or higher and about 1.4 V or lower.

BRIEF DESCRIPTION OF THE DRAWINGS

FIG. 3 is a diagram illustrating a semiconductor integrated circuit according to a second embodiment;

FIG. 4 is a diagram illustrating a semiconductor integrated circuit according to a third embodiment; and FIG. 5 is a diagram illustrating a semiconductor integrated circuit according to a fourth embodiment.

DETAILED DESCRIPTION

Figure 1:
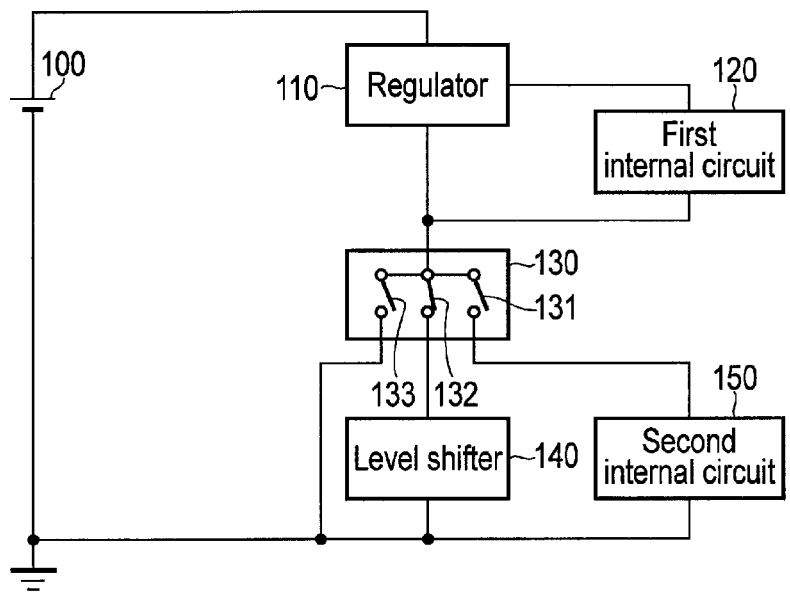
FIG. 1 is a diagram illustrating a semiconductor integrated circuit according to a first embodiment.

Embodiments will be described below with reference to the drawings.

According to an embodiment, a semiconductor integrated circuit includes a first regulator, a first internal circuit, a level shifter and a switch circuit. The first regulator includes a first terminal, a second terminal, and a third terminal and converts a first input voltage that is a difference in potential between the first terminal and the third terminal into a first output voltage that is a difference in potential between the second terminal and the third terminal. The first internal circuit is supplied power by the first output voltage. The level shifter includes a first terminal and a second terminal and adjusts a voltage level between the first terminal and the second terminal. The switch circuit includes a first switch selectively connecting the third terminal of the first regulator to a first potential, a second switch selectively connecting the third terminal of the first regulator to the first terminal of the level shifter, and a third switch selectively connecting the third terminal of the first regulator to a second potential.

Elements identical or similar to described elements are denoted by identical or similar reference numerals, and duplicate descriptions are basically omitted.

First Embodiment

As illustrated in FIG. 1, a semiconductor integrated circuit according to a first embodiment comprises a battery 100, a regulator 110, a first internal circuit 120, a switch circuit 130, a level shifter 140, and a second internal circuit 150.

The battery 100 generates a power supply voltage (=VBAT [V]). In this case, the power supply voltage is a difference in potential between a first terminal (high-potential terminal) and a second terminal (low-potential terminal) of the battery 100. In an example in FIG. 1, the second terminal of the battery 100 is grounded. The potential of the second terminal of the battery 100 is thus equal to a ground potential.

The regulator 110 comprises a first terminal (that is, an input terminal), a second terminal (that is, an output terminal), and a third terminal. The regulator 110 converts an input voltage into a stable output voltage (=VDD1 [V]). In this case, the input voltage is a difference in potential between the input terminal and the third terminal. The output voltage is a difference in potential between the output terminal and the third terminal. In the example in FIG. 1, the input terminal of the regulator 110 is connected to the first terminal of the battery 100. Thus, the potential of the input terminal is equal to the potential of the first terminal of the battery 100. The output voltage of the regulator 110 is used as a driving voltage for the first internal circuit 120.

The first internal circuit 120 is supplied power by the output voltage of the regulator 110. As described above, the output voltage of the regulator 110 is a difference in potential between the second terminal and the third terminal of the regulator 110.

The switch circuit 130 corresponds to a single pole triple throw switch. The switch circuit 130 includes, for example, a switch 131, a switch 132, and a switch 133. The switch circuit 130 selects a connection to the third terminal of the regulator 110 (that is, the potential of the third terminal) by controllably turning the switch 131, the switch 132 and the switch 133 on or off. The regulator 110 generates an output voltage based on the potential of the third terminal. Thus, the driving voltage that is supplied to the first internal circuit is constant regardless of a variation in the potential of the third terminal.

Specifically, by turning the switch 131 on, the switch circuit 130 can connect the third terminal of the regulator 110 to a first (power) terminal of the second internal circuit 150 described below. That is, the switch 131 selectively connects the third terminal of the regulator 110 to the first terminal of the second internal circuit. By turning the switch 132 on, the switch circuit 130 can connect the third terminal of the regulator 110 to a first terminal of the level shifter 140 described below. That is, the switch 132 selectively connects the third terminal of the regulator 110 to the first terminal of the level shifter 140. By turning the switch 133 on, the switch circuit 130 can connect the third terminal of the regulator 110 to the second terminal of the battery 100. That is, the switch 133 selectively connects the third terminal of the regulator 110 to the second terminal of the battery 100.

The level shifter 140 adjusts a voltage level. Specifically, the level shifter 140 can shift a difference in potential between a first terminal (high-potential terminal) and a second terminal (low-potential terminal) of the level shifter 140 from a low voltage to a high voltage or from a high voltage to a low voltage. In the example in FIG. 1, the second terminal of the level shifter 140 is grounded. Thus, the potential of the second terminal of the level shifter 140 is equal to the ground potential.

While the switch 133 is on, the second internal circuit 150 is connected in series to the first internal circuit 120. That is, while the switch 133 is on, the potential of a first terminal (high-potential terminal) of the second internal circuit 150 is equal to the potential of the third terminal of the regulator 110. A difference in potential between the first terminal and a second (power) terminal (low-potential terminal) of the second internal circuit 150 is used as a driving voltage (=VDD2 [V]) for the second internal circuit 150. In the example in FIG. 1, the second terminal of the second internal circuit 150 is grounded. Thus, the potential of the second terminal of the second internal circuit 150 is equal to the ground potential.

Figure 2:
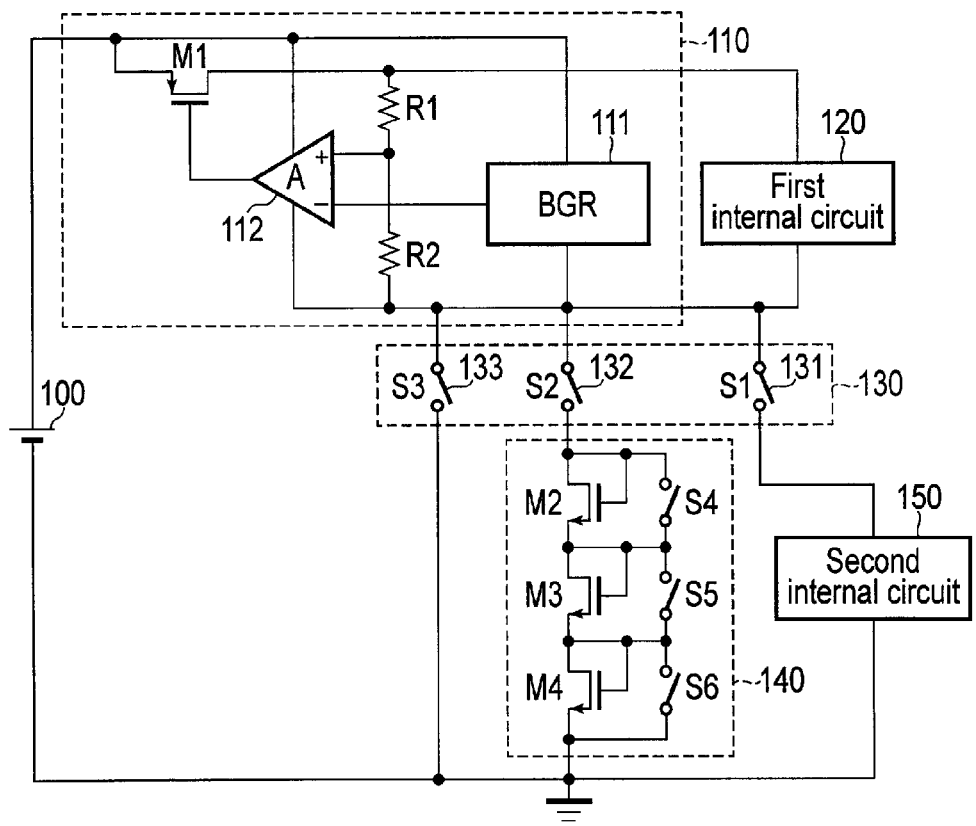
FIG. 2 is a diagram illustrating details of the semiconductor integrated circuit according to the first embodiment.

The semiconductor integrated circuit according to the first embodiment may be as illustrated in FIG. 2. In FIG. 2, the regulator 110 comprises a band gap reference (BGR) 111, an amplifier 112, a resistor R1, a resistor R2, and a transistor M1.

A source terminal of the transistor M1 is connected to a first terminal of the BGR 111. A drain terminal of the transistor M1 is connected to a first terminal (high-potential terminal) of the resistor R1. A gate terminal of the transistor M1 is connected to an output terminal of the amplifier 112.

The resistor R1 and the resistor R2 are connected together in series. Specifically, a first terminal of the resistor R1 corresponds to the output terminal of the regulator 110. A second terminal (low-potential terminal) of the resistor R1 is connected to a first terminal (high-potential terminal) of the resistor R2 and to a non-inverted input terminal of the amplifier 112. The first terminal of the resistor R2 is connected to the second terminal of the resistor R1. A second terminal (low-potential terminal) of the resistor R2 is connected to a third terminal of the BGR 111.

The BGR 111 comprises the first terminal (that is, an input terminal), a second terminal (that is, an output terminal), and the third terminal. The input terminal of the BGR 111 corresponds to the input terminal of the regulator 110. The output terminal of the BGR 111 is connected to an inverted input terminal of the amplifier 112. The third terminal of the BGR 111 corresponds to the third terminal of the regulator 110.

The BGR 111 can generate a stable reference voltage that is independent of the input voltage. The BGR 111 applies the reference voltage to the inverted input terminal of the amplifier 112. In this case, the input voltage is a difference in potential between the input terminal and third terminal of the BGR 111. The output voltage is a difference in potential between the output terminal and third terminal of the BGR 111.

The non-inverted input terminal of the amplifier 112 is connected to the second terminal of the resistor R1 and to the first terminal of the resistor R2. The inverted input terminal of the amplifier 112 is connected to the output terminal of the BGR 111. The output terminal of the amplifier 112 is connected to the gate terminal of the transistor M1. The amplifier 112 performs negative feedback control on the gate potential of the transistor M1. That is, when virtual grounding is established, a difference in potential between the non-inverted input terminal and inverted input terminal of the amplifier 112 is approximately zero.

Hence, the regulator 110 in FIG. 2 can obtain a stable output voltage (a difference in potential between the first terminal of the resistor R1 and the second terminal of the resistor R2). Specifically, the output voltage of the regulator 110 in FIG. 2 is approximately equal to the reference voltage of the BGR 111 multiplied by (R1+R2)/R2. R1 means the resistance value [Ω] of the resistor R1. R2 means the resistance value [Ω] of the resistor R2. That is, the appropriate selection of one of R1 and R2 allows the regulator 110 in FIG. 2 to provide the desired output voltage.

The level shifter 140 in FIG. 2 comprises transistors M2, M3, and M4 and switches S4, S5, and S6. Each of the transistors M2, M3, and M4 is diode-connected and provides a voltage drop of about 0.4 V. The transistors M2, M3, and M4 are connected together in series. In an example in FIG. 2, a source terminal of the transistor M4 is grounded.

The switch S4 is connected in parallel with the transistor M2, and in an on state, provides a bypass for the transistor M2. The switch S5 is connected in parallel with the transistor M3, and in the on state, provides a bypass for the transistor M3. The switch S6 is connected in parallel with the transistor M4, and in the on state, provides a bypass for the transistor M4.

The level shifter 140 is used in a stage when the potential of the third terminal of the regulator 110 is shifted from a low potential (that is, the ground potential) to a high potential (the potential of the first terminal of the second internal circuit 150).

That is, when the switch 131 (S1) is turned on, all the switches S4, S5, and S6 in the level shifter 140, are turned on in addition to the switch 132 (S2). In this case, the voltage of the level shifter 140 is 0 V. Then, the switch 131 (S1) is turned off, and for example, the switch S6 is further turned off. In this case, the voltage of the level shifter 140 is 0.4 V. Then, for example, the switches S5 and S4 are turned off in order, and the voltage of the level shifter 140 increases to 0.8 V and then to 1.2 V. Finally, the switch 133 (S3) is turned on and the switch 132 (S2) is turned off.

Similarly, the level shifter 140 is also used in a stage when the potential of the third terminal of the regulator 110 is shifted from a high potential to a low potential. In this case, the level shifter 140 may operate in an order reverse to the order used in the stage when the potential of the third terminal of the regulator 110 is shifted from a low potential to a high potential.

The range of the voltage level that can be adjusted by the level shifter 140 approximately matches the range from 0 [V] to VDD2 m. However, 0 [V] and VDD2 need not perfectly match the boundaries of the range. That is, the lower limit value of the range exists within a first allowable range around 0 [V], and the upper limit value of the range exists within a second allowable range around VDD2 [V]. The first allowable range and the second allowable range are defined in design so as to prevent the first internal circuit 120 from malfunctioning (for example, prevent reversal of the logic of a logical circuit included in the first internal circuit 120) when the on/off state of the switches included in the switch circuit 130 is changed.

As described above, the semiconductor integrated circuit according to the first embodiment can select the connection to the third terminal of the regulator by controllably turning the switches included in the switch circuit on or off. For example, when the third terminal of the regulator is connected to the first terminal (high-potential terminal) of the second internal circuit, the first internal circuit and the second internal circuit are connected in series. Hence, the regulator can efficiently (with reduced loss) supply the appropriate driving voltage to the first internal circuit. On the other hand, when the third terminal of the regulator is connected to the second terminal (low-potential terminal) of the battery, not only the potential of the third terminal but also the potentials of the input and output terminals of the regulator decrease. Thus, the regulator can stably supply the appropriate driving voltage to the first internal circuit even when the output voltage of the battery decreases. Moreover, in the stage when the potential of the third terminal of the regulator is shifted to a high potential or a low potential, the level shifter is utilized to allow suppression of malfunction of the first internal circuit caused by a rapid change in potential. The regulator generates an output voltage based on the potential of the third terminal. Consequently, a constant driving voltage is supplied to the first internal circuit regardless of a variation in the potential of the third terminal.

Second Embodiment

As illustrated in FIG. 3, a semiconductor integrated circuit according to a second embodiment comprises a battery 100, a first regulator 110, a first internal circuit 120, a switch circuit 130, a level shifter 140, a second internal circuit 250, and a second regulator 260. The first regulator 110 is identical to or similar to the regulator 110 in FIG. 1.

While the switch 133 is on, the second internal circuit 250 is connected in series to the first internal circuit 120. That is, while the switch 133 is on, the potential of a first terminal (high-potential terminal) of the second internal circuit 250 is equal to the potential of a third terminal of the first regulator 110. A difference in potential between the first terminal and a second terminal (low-potential terminal) of the second internal circuit 250 is used as a driving voltage (=VDD2 [V]) for the second internal circuit 250. In an example in FIG. 3, the second terminal of the second internal circuit 250 is grounded. Thus, the potential of the second terminal of the second internal circuit 250 is equal to the ground potential. On the other hand, the second internal circuit 250 is connected in parallel with the first internal circuit 120 while the switch 133 is off.

The second regulator 260 comprises a first terminal (that is, an input terminal), a second terminal (that is, an output terminal), and a third terminal. The second regulator 260 converts an input voltage into a stable output voltage (=VDD2 [V]). In this case, the input voltage is a difference in potential between the input terminal and the third terminal. The output voltage is a difference in potential between the output terminal and the third terminal. The output voltage of the second regulator 260 is used as a driving voltage for the second internal circuit 250.

In the example in FIG. 3, the input terminal of the second regulator 260 is connected to a first terminal of the battery 100. Thus, the potential of the input terminal is equal to the potential of the first terminal of the battery 100. However, the input terminal of the second regulator 260 may be connected to the third terminal of the first regulator 110 rather than to the first terminal of the battery 100. Furthermore, the third terminal of the second regulator 260 is connected to a second terminal of the battery 100. Thus, the potential of the third terminal is equal to the potential of the second terminal of the battery 100.

Now, it is assumed that VDD2 is 1.2 [V]. Moreover, if the battery 100 is a lithium ion battery, the output voltage (that is, the power supply voltage) of the battery 100 is about 3 [V]. Under these assumptions, when the first internal circuit 120 and the second internal circuit 250 are connected together in parallel, a loss of 1.8 (=3-1.2) [V] occurs. Hence, basically, the first internal circuit 120 and the second internal circuit 250 are preferably connected in series. Specifically, when the switch 131 is turned on and the switches 132 and 133 are turned off, the first internal circuit 120 and the second internal circuit 250 are connected in series. A technique has been described in the first embodiment which technique involves shifting the potential of the third terminal of the first regulator 110 from a low potential to a high potential. If VDD1 is also 1.2 V, the first internal circuit 120 and the second internal circuit 250 are connected in series, reducing the loss down to 0.6 (=3.0-2.4) [V].

In contrast, when the output voltage of the battery 100 decreases, the first internal circuit 120 and the second internal circuit 250 are preferably connected together in parallel. Specifically, when the switches 131 and 132 are turned off and the switch 133 is turned on, the first internal circuit 120 and the second internal circuit 250 are connected together in parallel. A technique has been described in the first embodiment which technique involves shifting the potential of the third terminal of the first regulator 110 from a high potential to a low potential. When the first internal circuit 120 and the second internal circuit 250 are connected together in parallel, VDD1 and VDD2 can be stably supplied even when the output voltage of the battery decreases. The period when the output voltage of the battery 100 decreases refers to a period when the output voltage is equal to or lower than the sum (plus a margin) of an operative voltage (for example, 1.0 [V] to 1.4 [V]) for the first internal circuit 120 and an operative voltage (for example, 1.0 [V] to 1.4 [V]) for the second internal circuit 250.

As described above, the semiconductor integrated circuit according to the second embodiment comprises the second regulator that supplies a stable driving voltage to the second internal circuit. The semiconductor integrated circuit basically connects the first internal circuit and the second internal circuit in series to allow the appropriate driving voltage to be efficiently supplied to these internal circuits. Moreover, when the output voltage of the battery decreases, the semiconductor integrated circuit connects the first internal circuit and the second internal circuit together in parallel to allow the appropriate driving voltage to be stably supplied to these internal circuits.

Third Embodiment

As illustrated in FIG. 4, a semiconductor integrated circuit according to a third embodiment comprises a battery 100, a first regulator 110, a first internal circuit 120, a switch circuit 130, a level shifter 140, a second internal circuit 250, a second regulator 260, and a voltage detection circuit 370.

The voltage detection circuit 370 detects the output voltage of the battery 100 and outputs a control signal to the switch circuit 130 in accordance with the result of the detection. For example, when the output voltage of the battery 100 is equal to or higher than a threshold, the voltage detection circuit 370 outputs a control signal to the switch circuit 130 to allow the first internal circuit 120 and the second internal circuit 250 to be connected in series. Specifically, when a switch 131 is turned on and switches 132 and 133 are turned on, the first internal circuit 120 and the second internal circuit 250 are connected in series. A technique has been described in the first embodiment which technique involves shifting the potential of the third terminal of the first regulator 110 from a low potential to a high potential.

On the other hand, when the output voltage of the battery 100 is lower than the threshold, the voltage detection circuit 370 outputs a control signal to the switch circuit 130 to connect the first internal circuit 120 and the second internal circuit 250 together in parallel. Specifically, when switches 131 and 132 are turned off and the switch 133 is turned on, the first internal circuit 120 and the second internal circuit 250 are connected together in parallel. A technique has been described in the first embodiment which technique involves shifting the potential of the third terminal of the first regulator 110 from a high potential to a low potential.

The threshold is, for example, the sum (plus a margin) of an operative voltage (for example, 1.0 [V] to 1.4 [V]) for the first internal circuit 120 and an operative voltage (for example, 1.0 [V] to 1.4 [V]) for the second internal circuit 250.

As described above, the semiconductor integrated circuit according to the third embodiment comprises the voltage detection circuit which detects the output voltage of the battery and which outputs the control signal to the switch circuit according to the result of the detection. When the output voltage of the battery is equal to or higher than the threshold, the first internal circuit and the second internal circuit are automatically connected in series and efficiently supplied with the appropriate driving voltage. Moreover, when the output voltage of the battery is lower than the threshold, the first internal circuit and the second internal circuit are automatically connected together in parallel and efficiently supplied with the appropriate driving voltage.

FIG. 4 shows the semiconductor integrated circuit according to the second embodiment to which the voltage detection circuit is applied. However, the semiconductor integrated circuit according to the third embodiment may be the semiconductor integrated circuit according to the first embodiment to which the voltage detection circuit is applied.

Fourth Embodiment

A semiconductor integrated circuit including a certain semiconductor memory supports not only a normal mode in which memory accesses (that is, reads or writes) are performed but also a standby mode provided for reduced power consumption. In the standby mode, the status of the semiconductor memory is maintained, but no access is performed on the semiconductor memory. When the total number of memory cells increases as a result of the increased scale of the semiconductor memory, the total leak current from these memory cells increases to a non-negligible level. A fourth embodiment efficiently reduces the leak current by applying the first to third embodiments during the standby mode of the semiconductor integrated circuit including the semiconductor memory.

As illustrated in FIG. 5, a semiconductor integrated circuit according to the fourth embodiment comprises a battery 100, a DC-DC converter 491, a switch 492, a first regulator 110, a first internal circuit 420, a switch circuit 130, a level shifter 140, a second internal circuit 450, a second regulator 260, word line switches 481, and bit line switches 482.

The DC-DC converter 491 can produce an efficient voltage drop during a high load period (for example, in a normal mode described below). Hence, in the normal mode, the switch 492 connected in parallel with the DC-DC converter 491 is turned off. That is, the DC-DC converter 491 is used to efficiently generate driving voltages for the first internal circuit 420 and the second internal circuit 450.

On the other hand, the DC-DC converter 491 suffers increased power loss (that is, becomes less efficient) during a low load period (for example, in a standby mode described below). Hence, in the standby mode, the switch 492 connected in parallel with the DC-DC converter 491 is turned on. That is, the DC-DC converter 491 is not used.

Each of the first internal circuit 420 and the second internal circuit 450 is a semiconductor memory (SRAM) circuit. That is, each of the first internal circuit 420 and the second internal circuit 450 includes a plurality of (in an example in FIG. 5, eight) memory cells.

The word line switches 481 switch between open circuiting and short circuiting of word lines provided between an X decoder and the plurality of memory cells included in the first internal circuit 420 and the second internal circuit 450. Specifically, the word line switches 481 short-circuit word lines in the normal mode (that is, while accesses are performed on the memory cells). On the other hand, the word line switches 481 open-circuit word lines in the standby mode (that is, while no access is performed on the memory cells). Open-circuiting word lines enables prevention of current leakage through the word lines and malfunction of the memory cells.

The bit line switches 482 switch between open circuiting and short circuiting of bit lines provided between a Y decoder and the plurality of memory cells included in the first internal circuit 420 and the second internal circuit 450. Specifically, the bit line switches 482 short-circuit bit lines in the normal mode (that is, while accesses are performed on the memory cells). On the other hand, the bit line switches 482 open-circuit bit lines in the standby mode (that is, while no access is performed on the memory cells). Open-circuiting bit lines enables prevention of current leakage through the bit lines and malfunction of the memory cells.

The first internal circuit 420 and the second internal circuit 450 are connected together in parallel in the normal mode. That is, in the switch circuit 130, the switches 131 and 132 are off, and the switch 133 is on.

Upon transitioning from the normal mode to the standby mode, the first internal circuit 420 and the second internal circuit 450 may be connected in series in order to reduce the leak current. That is, the switch 133 is turned off, and the switch 132 is turned on. Then, the level shifter 140 shifts the voltage level between a first terminal and a second terminal of the level shifter 140 from a low voltage to a high voltage. Then, the switch 132 is turned off, and the switch 131 is turned on. When the power supply voltage of the battery 100 decreases, the first internal circuit 420 and the second internal circuit 450 may remain connected together in parallel in order to avoid malfunction. For example, if the power supply voltage of the battery 100 is lower than double a specified voltage (for example, 0.7 [V]) for the first internal circuit 420 and the second internal circuit 450 in the standby mode, the first internal circuit 420 and the second internal circuit 450 need not be connected in series.

On the other hand, upon transitioning from the standby mode to the normal mode, the first internal circuit 420 and the second internal circuit 450 are connected together in parallel. That is, the switch 131 is turned off, and the switch 132 is turned on. Then, the level shifter 140 shifts the voltage level between the first terminal and second terminal of the level shifter 140 from the high voltage to the low voltage. Then, the switch 132 is turned off, and the switch 133 is turned on.

As described above, in the standby mode in which no memory access is performed, the semiconductor integrated circuit according to the fourth embodiment series connects the first internal circuit and the second internal circuit, each including the plurality of memory cells, in series and short-circuits word lines and bit lines. Thus, the semiconductor integrated circuit enables a reduction in leak current from the memory cells while preventing current leakage through word lines and bit lines as well as malfunction. Moreover, like the first to third embodiments, the fourth embodiment allows the appropriate driving voltage to be efficiently supplied to the first internal circuit and the second internal circuit.

The semiconductor integrated circuits according to the first to fourth embodiments can be mounted in various information processing apparatuses. The information processing apparatuses can exert effects identical or similar to the effects of the first to fourth embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a first regulator comprising a first terminal, a second terminal, and a third terminal and configured to convert a first input voltage that is a difference in potential between the first terminal and the third terminal into a first output voltage that is a difference in potential between the second terminal and the third terminal;
   a first internal circuit configured to be supplied power by the first output voltage;
   a level shifter comprising a first terminal and a second terminal and configured to adjust a voltage level between the first terminal and the second terminal; and
   a switch circuit including a first switch selectively connecting the third terminal of the first regulator to a first potential, a second switch selectively connecting the third terminal of the first regulator to the first terminal of the level shifter, and a third switch selectively connecting the third terminal of the first regulator to a second potential.

2. The circuit according to claim 1, further comprising a second internal circuit comprising a first power terminal and a second power terminal,
   wherein the first potential is a potential of the first power terminal of the second internal circuit, and
   the second potential is a ground potential.

3. The circuit according to claim 2, wherein the level shifter adjusts the voltage level within a predetermined range,
   a lower limit value of the predetermined range exists within a first allowable range around 0 [V], and
   an upper limit value of the predetermined range exists within a second allowable range around a voltage between the first power terminal and the second power terminal of the second internal circuit.

4. The circuit according to claim 2, further comprising a second regulator comprising a first terminal, a second terminal, and a grounded third terminal and configured to convert a second input voltage that is a difference in potential between the first terminal and the third terminal into a second output voltage that is a difference in potential between the second terminal and the third terminal,
   wherein the second internal circuit is supplied power by the second output voltage.

5. The circuit according to claim 2, wherein the switch circuit sets the first switch, the second switch, and the third switch on or off based on a control signal.

6. The circuit according to claim 5, further comprising a voltage detection circuit configured to detect a power supply voltage that is a difference in potential between the first terminal of the first regulator and the ground potential to output a control signal according to a result of the detection to the switch circuit.

7. The circuit according to claim 6, wherein the voltage detection circuit outputs a control signal for turning the first switch on to the switch circuit when the power supply voltage is equal to or higher than a threshold and outputs a control signal for turning the third switch on to the switch circuit when the power supply voltage is lower than the threshold.

8. The circuit according to claim 2, further comprising:
   word line switches configured to switch between open circuiting and short circuiting of word lines provided between an X decoder and a plurality of memory cells; and
   bit line switches configured to switch between open circuiting and short circuiting of bit lines provided between a Y decoder and the plurality of memory cells,
   wherein each of the first internal circuit and the second internal circuit includes at least a certain number of the plurality of memory cells.

9. The circuit according to claim 8, wherein the first internal circuit and the second internal circuit support a normal mode in which access is performed on the plurality of memory cells and a standby mode in which no access is performed on the plurality of memory cells and statuses of the plurality of memory cells are maintained, and
   when the first internal circuit and the second internal circuit transit from the normal mode to the standby mode, the word line switches and the bit line switches open-circuit word lines and bit lines, the switch circuit turns the third switch off and turns the second switch on, and after the second switch is turned on, the level shifter shifts the voltage level from a low voltage to a high voltage, and after the voltage level shifts to the high voltage, the switch circuit turns the second switch off and turns the first switch on.

10. An information processing apparatus comprising the semiconductor integrated circuit according to claim 1.

* * * * *